United States Patent
Hirasawa et al.

(10) Patent No.: US 11,145,795 B2
(45) Date of Patent: Oct. 12, 2021

(54) LIGHT EMITTING APPARATUS AND METHOD FOR MANUFACTURING SAME

(71) Applicants: CITIZEN ELECTRONICS CO., LTD., Fujiyoshida (JP); CITIZEN WATCH CO., LTD., Nishitokyo (JP)

(72) Inventors: Koki Hirasawa, Otsuki (JP); Nodoka Oyamada, Fujiyoshida (JP); Yuji Omori, Yamanashi (JP)

(73) Assignees: CITIZEN ELECTRONICS CO., LTD., Fujiyoshida (JP); CITIZEN WATCH CO., LTD., Nishitokyo (JP)

( * ) Notice: Subject to any disclaimer, the term of this patent is extended or adjusted under 35 U.S.C. 154(b) by 409 days.

(21) Appl. No.: 16/095,586

(22) PCT Filed: May 30, 2017

(86) PCT No.: PCT/JP2017/020148
§ 371 (c)(1),
(2) Date: Oct. 22, 2018

(87) PCT Pub. No.: WO2017/209143
PCT Pub. Date: Dec. 7, 2017

(65) Prior Publication Data
US 2020/0357775 A1 Nov. 12, 2020

(30) Foreign Application Priority Data
May 31, 2016 (JP) .............................. JP2016-109594

(51) Int. Cl.
*H01L 33/54* (2010.01)
*H01L 25/075* (2006.01)
(Continued)

(52) U.S. Cl.
CPC ............ *H01L 33/54* (2013.01); *H01L 21/563* (2013.01); *H01L 23/3135* (2013.01);
(Continued)

(58) Field of Classification Search
CPC ..... H01L 25/0753; H01L 33/54; H01L 33/58; H01L 33/644; H01L 25/13; H01L 33/486;
(Continued)

(56) References Cited

U.S. PATENT DOCUMENTS 8,519,426 B2 * 8/2013 Lee .................... H01L 33/60
257/99
9,093,281 B2 * 7/2015 Tomohiro ............ H01L 33/382
(Continued)

FOREIGN PATENT DOCUMENTS

JP 2004-265986 A 9/2004
JP 2004-311791 A 11/2004
(Continued)

OTHER PUBLICATIONS

International Search Report and Written Opinion for PCT/JP2017/020148, dated Aug. 15, 2017, in 21 pages.

*Primary Examiner* — Eduardo A Rodela
(74) *Attorney, Agent, or Firm* — Procopio, Cory, Hargreaves & Savitch LLP

(57) ABSTRACT

A light-emitting apparatus and a method for manufacturing the same are provided in which heat dissipation from an LED package to a heat sinking substrate is improved while electrical insulation therebetween is ensured. The light-emitting apparatus includes a circuit board having an opening, an LED package inserted into the opening from the back side of the circuit board and having an edge connected to the back side of the circuit board, and a heat sinking substrate disposed on the back side of the circuit board so as to be in contact with the LED package. The LED package includes: an LED device; a lead frame including a mounting part having an upper surface on which the LED device is mounted and a back surface being in contact with the heat sinking substrate, and an electrode part being thinner than the mounting part and electrically connected to the LED (Continued)

device and the circuit board; an insulating resin filled between the mounting part and the electrode part and between the electrode part and the heat sinking substrate; and a sealing resin filled into a region on the mounting part to seal the LED device.

6 Claims, 17 Drawing Sheets

(51) Int. Cl.
| | |
|---|---|
| *H01L 33/58* | (2010.01) |
| *H01L 33/64* | (2010.01) |
| *H05K 1/02* | (2006.01) |
| *H05K 1/18* | (2006.01) |
| *H01L 33/56* | (2010.01) |
| *H01L 23/31* | (2006.01) |
| *H01L 21/56* | (2006.01) |
| *H01L 25/13* | (2006.01) |
| *H01L 33/48* | (2010.01) |

(52) U.S. Cl.
CPC .......... *H01L 25/0753* (2013.01); *H01L 33/56* (2013.01); *H01L 33/58* (2013.01); *H01L 33/64* (2013.01); *H01L 33/644* (2013.01); *H05K 1/0281* (2013.01); *H05K 1/182* (2013.01); *H05K 1/189* (2013.01); *H01L 25/13* (2013.01); *H01L 33/486* (2013.01); *H01L 33/647* (2013.01); *H01L 2933/005* (2013.01); *H01L 2933/0058* (2013.01); *H01L 2933/0066* (2013.01); *H01L 2933/0075* (2013.01); *H05K 2201/10106* (2013.01); *H05K 2201/2009* (2013.01)

(58) Field of Classification Search
CPC ............. H01L 33/647; H01L 2933/005; H01L 2933/0058; H01L 2933/0066; H01L 2933/0075; H01L 33/56; H01L 2224/49113; H01L 2224/48091; H01L 2224/48137; H01L 33/64; H01L 33/00; H01L 33/005; H01L 33/48; H01L 33/483; H01L 33/52; H01L 33/62; H01L 23/043; H01L 23/053; H01L 23/12; H01L 23/13; H01L 23/28; H01L 23/29; H01L 23/293; H01L 23/31; H01L 23/3107; H01L 23/3121; H01L 23/3135; H01L 21/56; H01L 21/563; H05K 1/0281; H05K 1/182; H05K 1/189; H05K 2201/10106; H05K 2201/2009

See application file for complete search history.

(56) References Cited

U.S. PATENT DOCUMENTS

| | | | |
|---|---|---|---|
| 2004/0169451 A1 | 9/2004 | Oishi et al. | |
| 2004/0208210 A1 | 10/2004 | Inoguchi | |
| 2008/0048204 A1* | 2/2008 | Ishikura | H01L 33/64 257/99 |
| 2008/0203423 A1 | 8/2008 | Miyashita | |
| 2009/0026485 A1* | 1/2009 | Urano | H01L 33/483 257/99 |
| 2009/0050925 A1* | 2/2009 | Kuramoto | H01L 33/34 257/100 |
| 2011/0186868 A1 | 8/2011 | Watari et al. | |
| 2012/0187430 A1* | 7/2012 | West | H01L 25/0753 257/88 |
| 2013/0087822 A1* | 4/2013 | Kim | H01L 33/54 257/98 |
| 2013/0121000 A1* | 5/2013 | Lee | H01L 33/56 362/293 |
| 2013/0257266 A1* | 10/2013 | Ishizaki | H01L 33/504 313/503 |
| 2014/0203305 A1* | 7/2014 | Kawano | H01L 33/50 257/88 |
| 2014/0233239 A1* | 8/2014 | Matsuda | F21V 1/16 362/294 |
| 2014/0306245 A1 | 10/2014 | Hayashi et al. | |
| 2020/0066943 A1* | 2/2020 | Tamura | F21V 19/00 |

FOREIGN PATENT DOCUMENTS

| | | |
|---|---|---|
| JP | 2006-019319 A | 1/2006 |
| JP | 2006-156704 A | 6/2006 |
| JP | 2008-205107 A | 9/2008 |
| JP | 2011-159951 A | 8/2011 |
| JP | 2011-176270 A | 9/2011 |
| JP | 2014-112614 A | 6/2014 |
| JP | 2014-220490 A | 11/2014 |

* cited by examiner

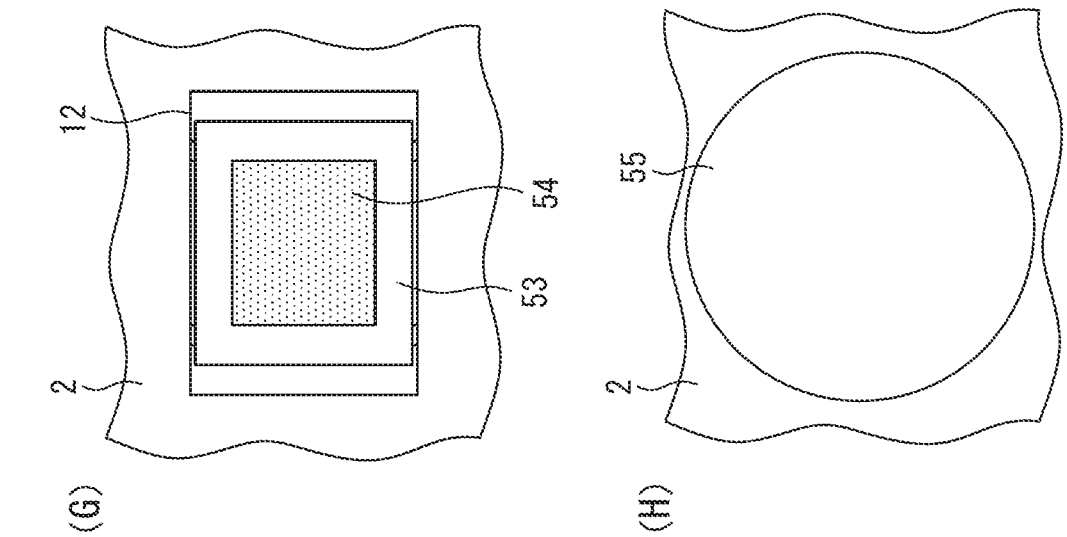
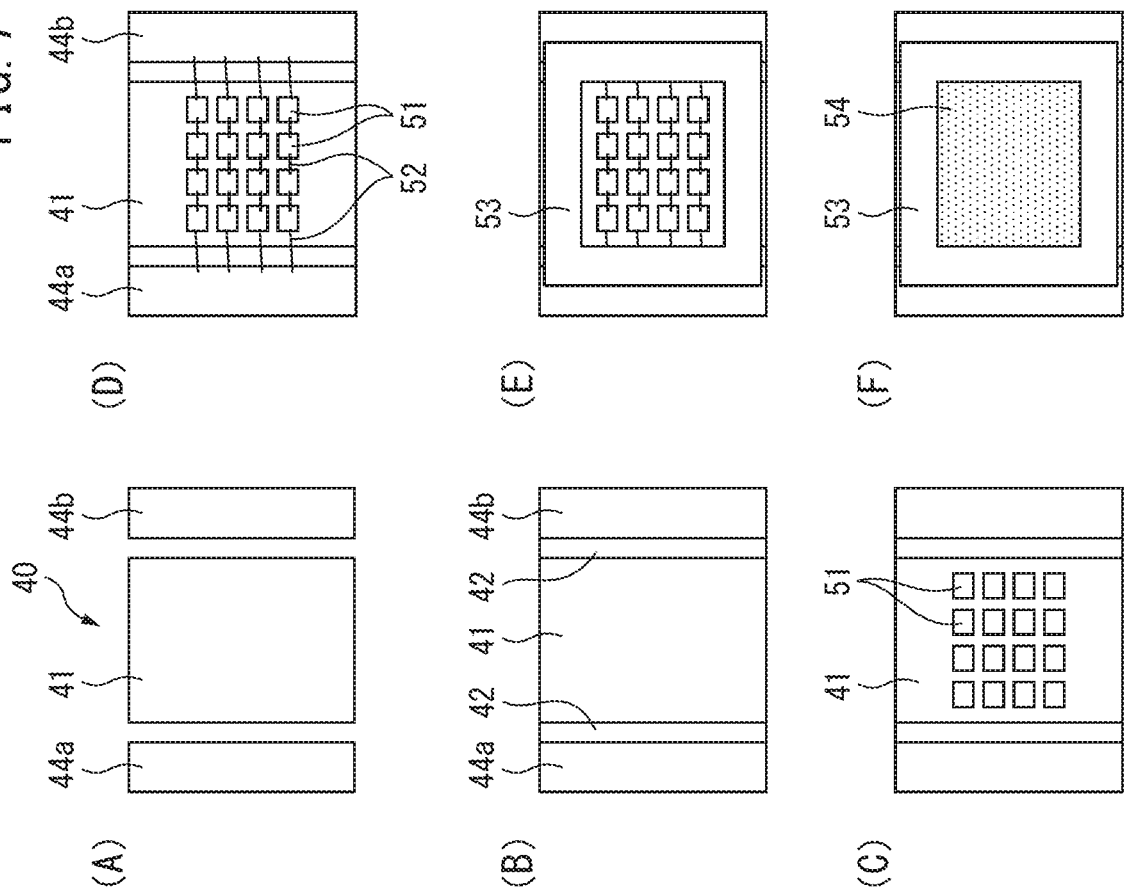
FIG. 7

FIG. 9
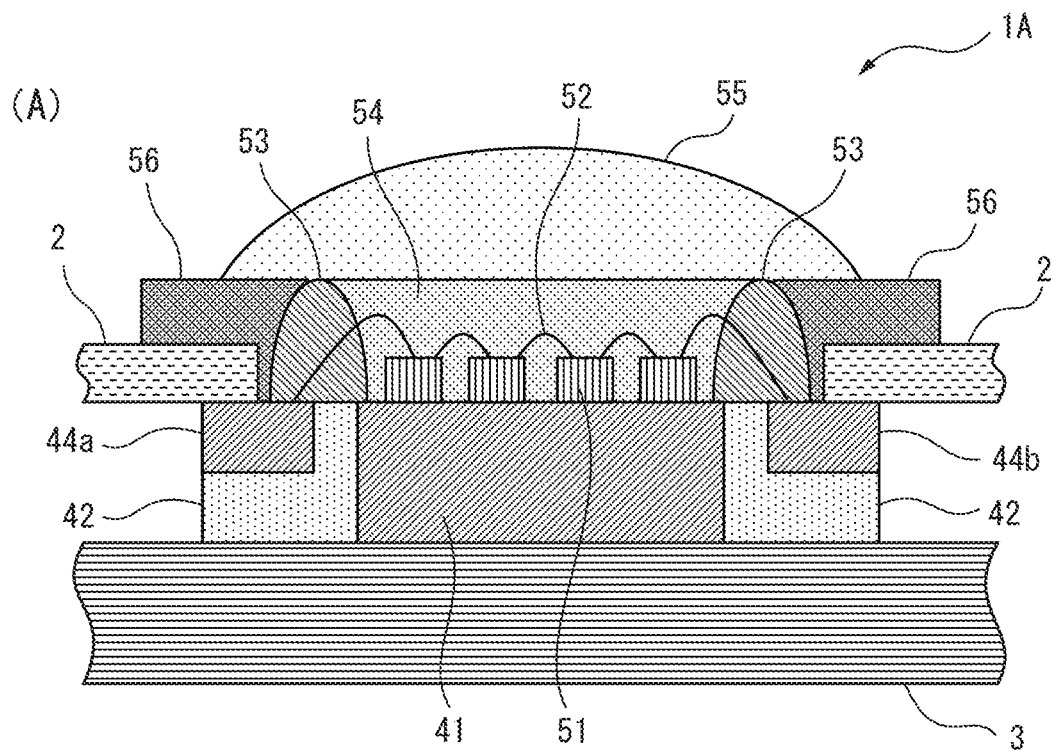
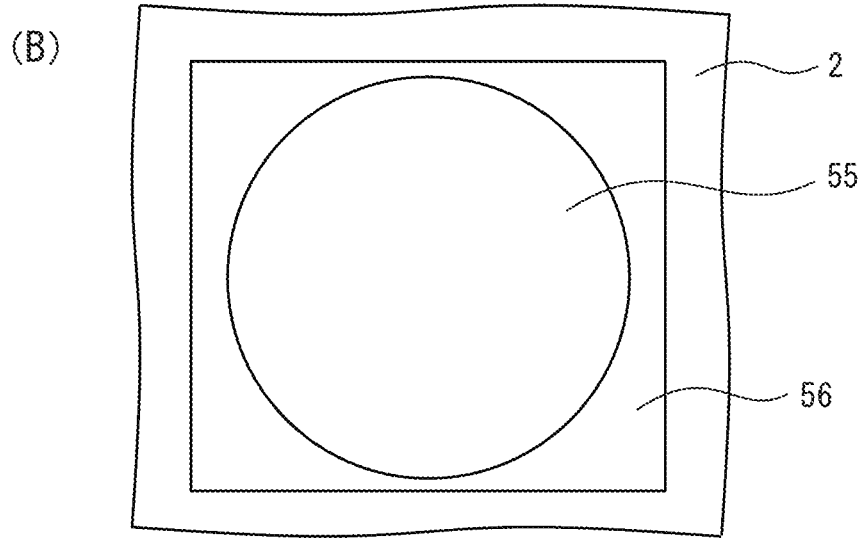

FIG. 14
(A)
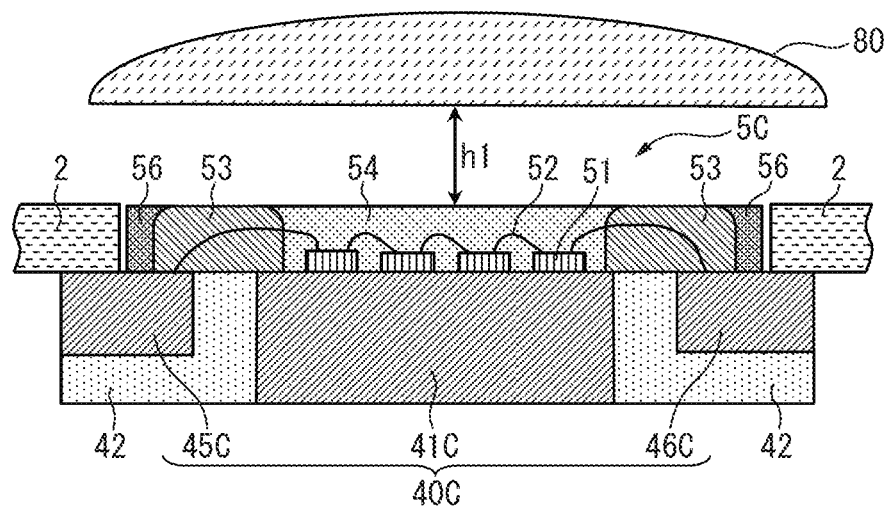
(B)
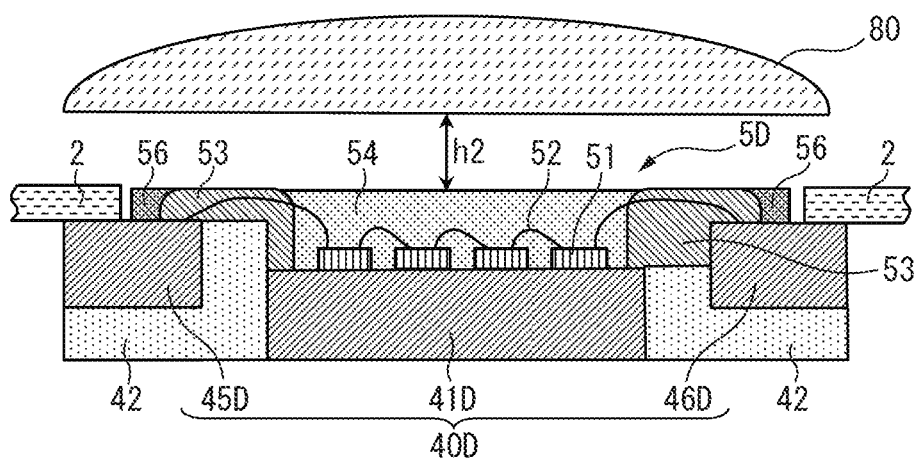
(C)
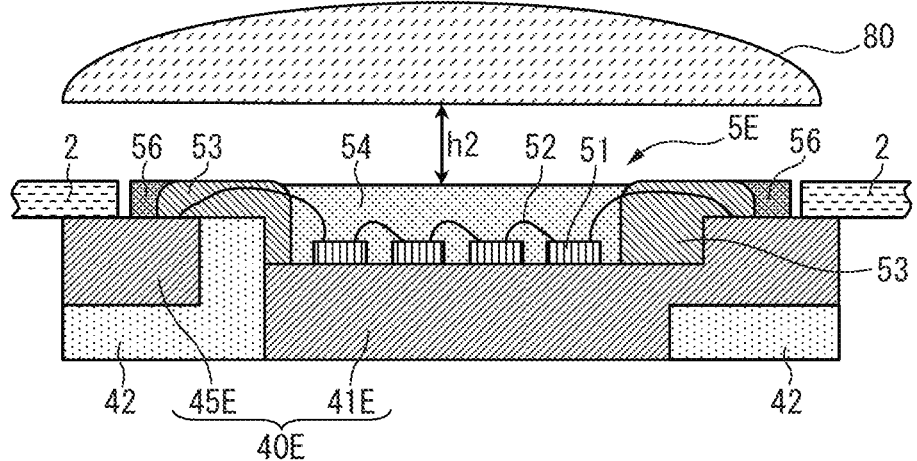

LIGHT EMITTING APPARATUS AND METHOD FOR MANUFACTURING SAME

CROSS-REFERENCE TO RELATED APPLICATIONS

This application is a U.S. National Stage entry of PCT Application No: PCT/JP2017/020148 filed May 30, 2017, which claims priority to Japanese Patent Application No. 2016-109594, filed May 31, 2016, the contents of which are incorporated herein by reference.

FIELD

The present invention relates to a light-emitting apparatus and a method for manufacturing the same.

BACKGROUND

In recent years, surface-mounted light-emitting diode (LED) packages have come into wide use in light-emitting apparatuses serving as light sources for various kinds of lighting equipment, for example.

FIG. 18 is a cross-sectional view of a conventional surface-mounted LED package 6. The LED package 6 includes LED devices 51, a resin frame 53, a sealing resin 54, a lens resin 55 and a lead frame 60. The lead frame 60 is composed of a mounting part 61 and electrode parts 64a and 64b with an insulating resin 62 interposed therebetween, and is mounted on a circuit board 70. The circuit board 70 includes an insulating layer 72 and conductive patterns 71 formed thereon, and is disposed on a heat sinking substrate 3. The mounting part 61 and the electrode parts 64a and 64b are in contact with the conductive patterns 71. The LED devices 51 are mounted on the mounting part 61, electrically connected by bonding wires (hereinafter, simply referred to as wires) 52 to the electrode parts 64a and 64b, sealed by the sealing resin 54 filled into the resin frame 53, and further covered by the lens resin 55.

Patent Literature 1 describes a high-luminance light-emitting device including a base having thermal conductivity, a circuit board having conductive portions adhering to the base, and a light-emitting device chip mounted on a mounting area of the base. In this high-luminance light-emitting device, the base has a heat sinking surface for discharging heat from the light-emitting device chip; the conductive portions of the circuit board are connected by electrically connecting components to the light-emitting device chip; part of the conductive portions have electrically connecting surfaces for supplying a current driving the light-emitting device chip; and the electrically connecting surfaces and the heat sinking surface are placed on opposite sides of the base.

Patent Literature 2 describes a back mounting LED manufactured by mounting an LED chip on an electrode pattern formed on an insulating base substrate, sealing the LED chip with a translucent resin, and thereafter mounting the LED chip on a mounting substrate from the back side thereof so that the sealing resin is included in a through hole provided for the mounting substrate.

CITATIONS LIST

Patent Literature

Patent Literature 1: Japanese Unexamined Patent Publication No. 2004-265986

Patent Literature 2: Japanese Unexamined Patent Publication No. 2008-205107

SUMMARY

In the LED package 6 shown in FIG. 18, the mounting part 61 and the electrode parts 64a and 64b through which heat generated by the LED devices 51 is discharged are exposed on the back side of the package. Accordingly, disposing the LED package 6 on the metal heat sinking substrate 3 requires interposing the insulating layer 72 so as to ensure electrical insulation. Since an insulating material generally has much lower thermal conductivity than a metal, mounting the LED package shown in FIG. 18 on a mother board (circuit board) provided with a heat sink results in insufficient heat dissipation from the lead frame to the heat sink (heat sinking substrate).

It is an object of the present invention to provide a light-emitting apparatus and a method for manufacturing the same in which heat dissipation from an LED package to a heat sinking substrate is improved while electrical insulation therebetween is ensured.

Provided is a light-emitting apparatus including a circuit board having an opening, an LED package inserted into the opening from the back side of the circuit board and having an edge connected to the back side of the circuit board, and a heat sinking substrate disposed on the back side of the circuit board so as to be in contact with the LED package. The LED package includes: at least one LED device; a lead frame including a mounting part having an upper surface on which the at least one LED device is mounted and a back surface being in contact with the heat sinking substrate, and an electrode part being thinner than the mounting part and electrically connected to the at least one LED device and the circuit board; an insulating resin filled between the mounting part and the electrode part and between the electrode part and the heat sinking substrate; and a sealing resin filled into a region on the mounting part to seal the at least one LED device.

Preferably, in the above light-emitting apparatus, the LED package further includes: a resin frame defining the region into which the sealing resin is filled; a lens resin filled so as to cover the sealing resin, the lens resin condensing light emitted from the at least one LED device through the sealing resin; and a reinforcing resin being harder than the lens resin and disposed between the circuit board and the lens resin so as to enclose an outer portion of the resin frame.

Preferably, in the above light-emitting apparatus, the circuit board is a flexible printed circuit, and is bent along side surfaces of the lead frame so as not to form a space between the circuit board and the heat sinking substrate.

Preferably, in the above light-emitting apparatus, the mounting part of the lead frame has an uneven side surface formed so as to extend along side surfaces of the electrode part, and a portion of the insulating resin filled between the mounting part and the electrode part is bent in a plurality of directions along the uneven side surface of the mounting part.

Preferably, in the above light-emitting apparatus, the upper surface of the mounting part of the lead frame is higher than the upper surface of the electrode part, and is placed higher than the back surface of the circuit board in the opening of the circuit board.

Preferably, in the above light-emitting apparatus, the upper surface of a portion of the mounting part of the lead frame where the at least one LED device is mounted is lower than the upper surface of the electrode part.

Preferably, in the above light-emitting apparatus, at least one of the mounting part and the electrode part of the lead frame has a step in a vertical cross section, and the insulating resin is filled into a recess of the mounting part or the electrode part formed by the step.

Preferably, in the above light-emitting apparatus, at least one of the mounting part and the electrode part of the lead frame has a side surface provided with a cut, and the insulating resin is filled into the cut.

Preferably, in the above light-emitting apparatus, at least one of the mounting part and the electrode part of the lead frame has a through hole, and the insulating resin is filled into the through hole.

Preferably, in the above light-emitting apparatus, the upper surface of the mounting part of the lead frame has a cross shape, and the electrode part is composed of four portions disposed at four corners of the rectangle in which the cross shape is inscribed.

Preferably, in the above light-emitting apparatus, the at least one LED device includes a plurality of LED devices disposed on the mounting part of the lead frame, and the plurality of LED devices is divided into groups connected in parallel with each other, and positive and negative electrodes of LED devices in each of the groups are electrically connected by wires to two of the four portions of the electrode part.

Preferably, in the above light-emitting apparatus, the at least one LED device includes a plurality of LED devices disposed on the mounting part of the lead frame, and the plurality of LED devices is divided into groups connected in parallel with each other, and positive and negative electrodes of LED devices in each of the groups are electrically connected by wires to the mounting part and one of the four portions of the electrode part.

Provided is a method for manufacturing a light-emitting apparatus including the steps of manufacturing a lead frame composed of a mounting part and an electrode part which is disposed at an edge of the mounting part and thinner than the mounting part; filling an insulating resin between the mounting part and the electrode part and into a space on the back side of the electrode part; mounting an LED device on the upper surface of the mounting part, and electrically connecting the LED device to the electrode part; filling a sealing resin into a region on the mounting part to seal the LED device, thereby manufacturing an LED package including the lead frame, the insulating resin, the LED device and the sealing resin; and inserting the LED package into an opening of a circuit board from the back side of the circuit board, and electrically connecting the electrode part to the back side of the circuit board, while disposing a heat sinking substrate on the back side of the circuit board so that a portion of the insulating resin on the back side of the electrode part and the back surface of the mounting part are in contact with the heat sinking substrate.

In the above light-emitting apparatus, heat dissipation from the LED package to the heat sinking substrate is improved while electrical insulation therebetween is ensured.

BRIEF DESCRIPTION OF DRAWINGS

FIGS. 7(A) to 7(H) are top views for explaining a manufacturing process of the light-emitting apparatus 1.

FIGS. 9(A) and 9(B) are a cross-sectional view and a top view of an LED package 5 of a light-emitting apparatus A.

FIGS. 14(A) to 14(C) are cross-sectional views of LED packages 5C to 5E.

DESCRIPTION OF EMBODIMENTS

Hereinafter, with reference to the accompanying drawings, light-emitting apparatuses will be explained in detail. However, it should be noted that the present invention is not limited to the drawings or the embodiments described below.

Figure 1:
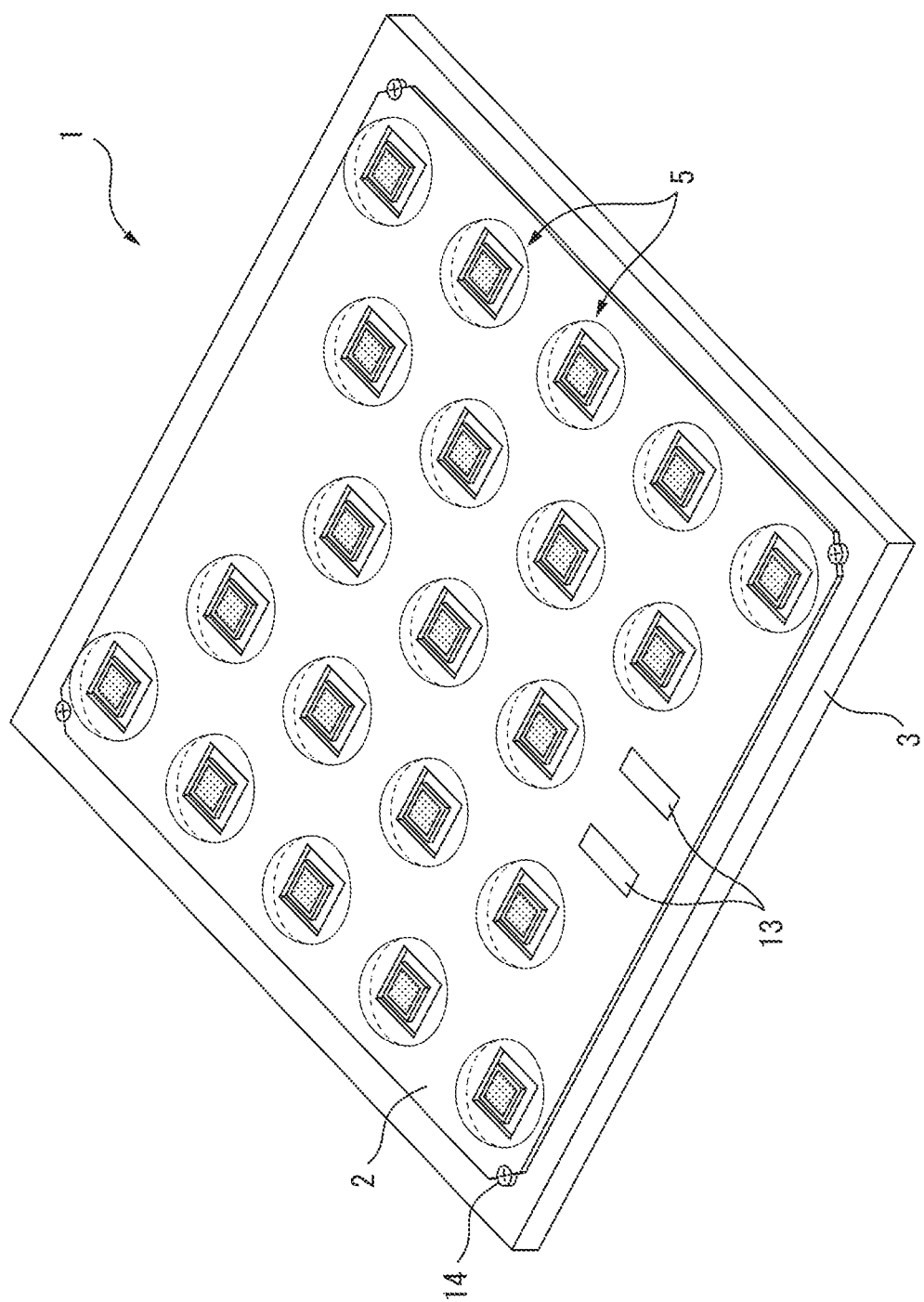
FIG. 1 is a perspective view of a light-emitting apparatus 1.
Figure 2:
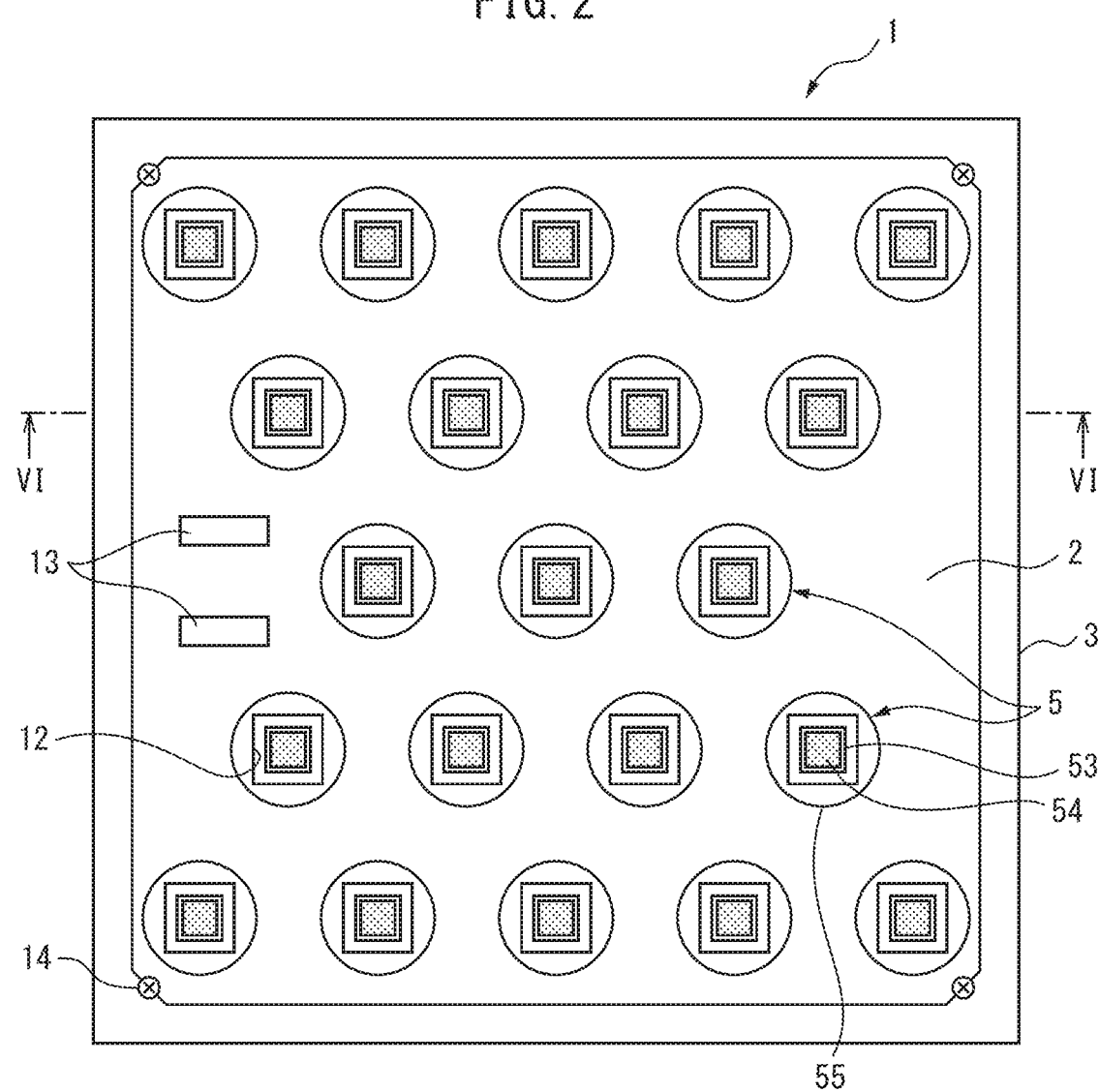
FIG. 2 is a top view of the light-emitting apparatus 1.
Figure 3:
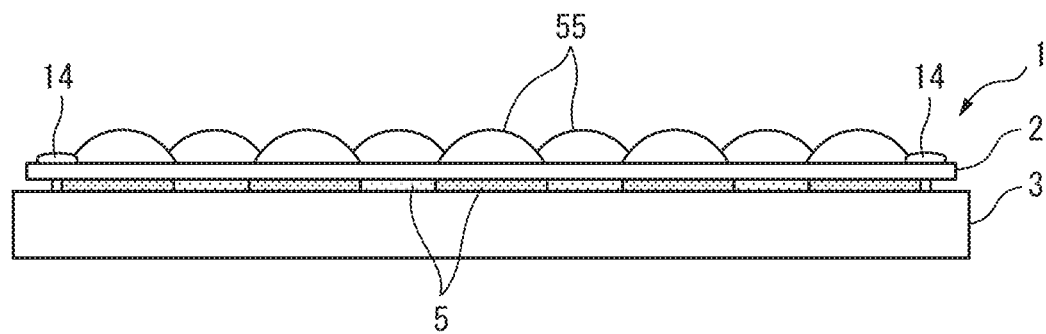
FIG. 3 is a side view of the light-emitting apparatus 1.
Figure 4:
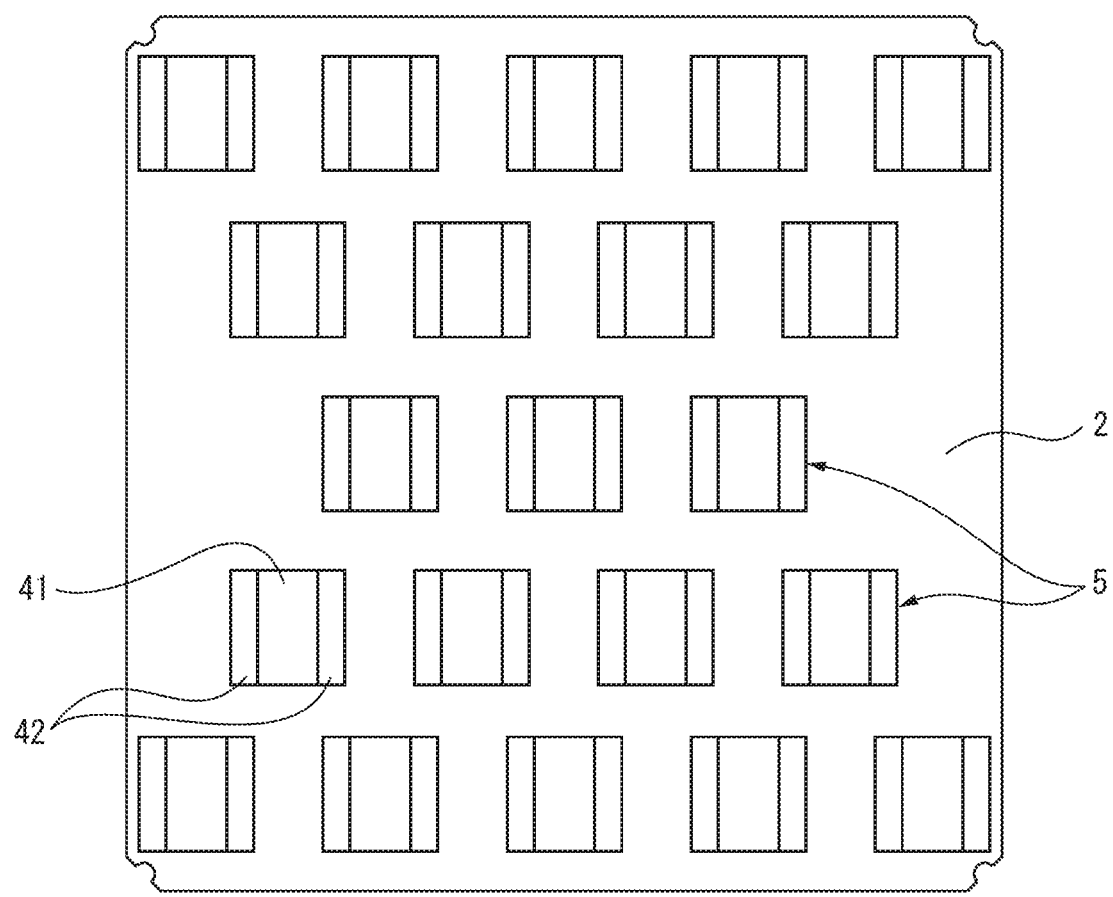
FIG. 4 is a back view of the light-emitting apparatus 1 from which the heat sinking substrate 3 is removed.

FIGS. 1 to 3 are a perspective view, a top view and a side view of a light-emitting apparatus 1, respectively. The light-emitting apparatus 1 has a structure in which multiple LED packages 5 are mounted on a circuit board 2 from the back side thereof and a heat sinking substrate 3 is further disposed on the back side of the LED packages 5. FIG. 4 is a back view of the light-emitting apparatus 1 from which the heat sinking substrate 3 is removed. The light-emitting apparatus 1 includes twenty-one LED packages 5 as light-emitting parts, and is used as a light source apparatus for various kinds of lighting equipment, for example. However, twenty-one is only an example; the number of LED packages 5 is not specifically limited, and may be one, for example.

Figure 5:
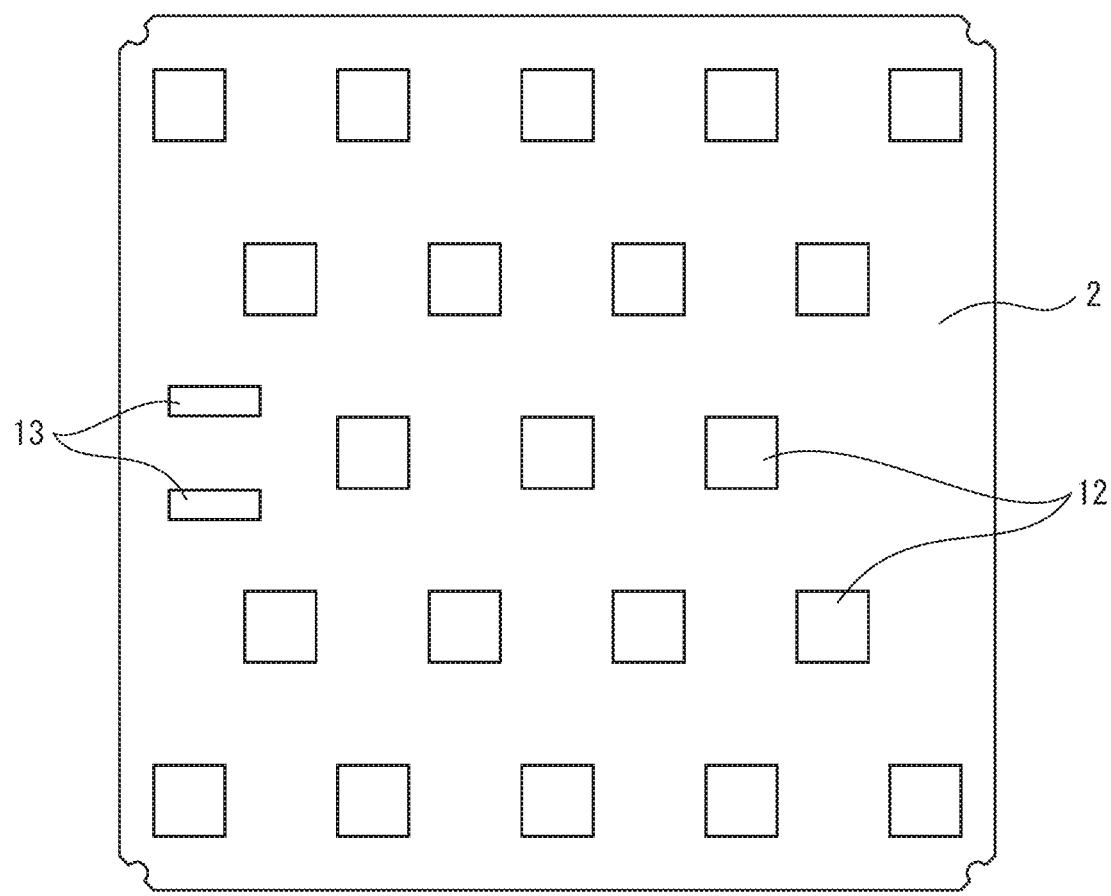
FIG. 5 is a top view of the circuit board 2.

FIG. 5 is a top view of the circuit board 2. The circuit board 2 (mother board) is a substantially rectangular insulating substrate, and is formed from a glass epoxy substrate whose base material is Flame Retardant Type 4 (FR-4), for example, in order to ensure mechanical strength and heat resistance. In the illustrated example, the circuit board 2 has twenty-one evenly spaced openings 12 into which the LED packages 5 are inserted.

At the left edge of the circuit board 2 shown in FIGS. 2 and 5, two electrodes 13 for connecting the light-emitting apparatus 1 to an external power source are attached. The circuit board 2 is also provided with conductive patterns for electrically connecting the electrodes 13 and the LED packages 5 mounted at the respective openings 12 (in other words, connecting the LED packages 5 to each other), although illustration thereof is omitted. Connecting the electrodes 13 to an external power source and applying a voltage thereacross causes the LED packages 5 to emit light. At this time, all of the LED packages 5 in the light-emitting apparatus 1 may emit light at the same time, or only some of them may emit light, depending on the routing of the conductive patterns on the circuit board 2.

The heat sinking substrate 3 is a rectangular metal substrate which is disposed on the back side of the circuit board 2 and is in contact with package substrates of the LED packages 5 so that the LED packages 5 are sandwiched between the heat sinking substrate 3 and the circuit board 2. The heat sinking substrate 3 is made of a material such as aluminum or copper, which excels in heat resistance and heat dissipation, since it functions as a heat sink which causes heat generated by the LED packages 5 to be discharged outside the light-emitting apparatus 1. However, the heat sinking substrate 3 may be made of a material other than aluminum and copper, as long as it excels in heat resistance and heat dissipation. Further, it is not necessary for all of the LED packages 5 to be in contact with one heat sinking substrate 3. The heat sinking substrate 3 may be composed of a plurality of pieces; and some of the LED packages 5 and the other LED packages 5 may be in contact with different pieces of the heat sinking substrate 3. As shown in FIGS. 1 to 3, the circuit board 2 and the heat sinking substrate 3 are fixed to each other at the four corners thereof by screws 14.

Figure 6:
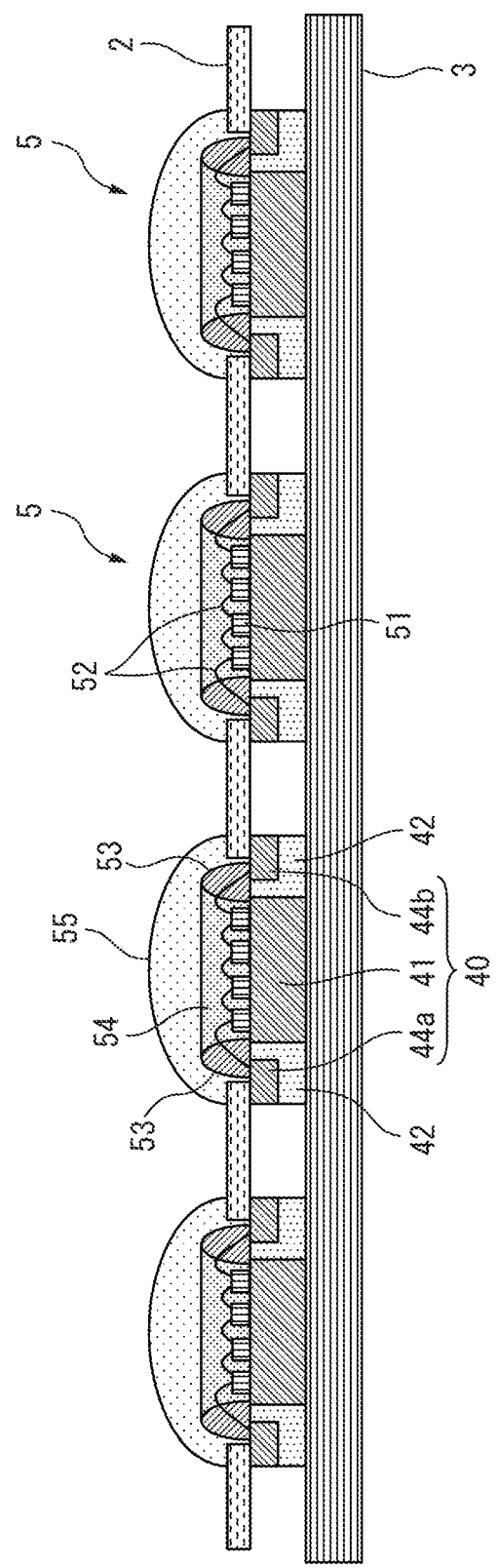
FIG. 6 is a cross-sectional view of the light-emitting apparatus 1 taken along line VI-VI in FIG. 2.

FIG. 6 is a cross-sectional view of the light-emitting apparatus 1 taken along line VI-VI in FIG. 2. Each of the LED packages 5 includes a lead frame 40, an insulating resin 42, LED devices 51, a resin frame 53, a sealing resin 54 and a lens resin 55. The portion of each LED package 5 higher than the lead frame 40 is inserted into the corresponding opening 12 from the back side of the circuit board 2. Each LED package 5 is soldered to the back surface of the circuit board 2 at edges of the lead frame 40.

The lead frame 40 is composed of: a mounting part 41 having an upper surface on which the LED devices 51 are mounted, and a back surface being in contact with the heat sinking substrate 3; and electrode parts 44a and 44b being thinner than the mounting part 41 and electrically connected to the LED devices 51 and the circuit board 2. The mounting part 41 and the heat sinking substrate 3 are electrically insulated from the electrode parts 44a and 44b by the insulating resin 42 filled therebetween. Of the surfaces of the electrode parts 44a and 44b, only the upper surfaces and the side surfaces opposite to the mounting part 41 are exposed, since the side surfaces on the mounting part 41 side and the back surfaces on the heat sinking substrate 3 side are covered by the insulating resin 42. These exposed upper surfaces are connected to wires 52 and the conductive patterns of the circuit board 2.

The LED devices 51 are blue LEDs made of a gallium nitride compound semiconductor, for example, and emit blue light at a wavelength in the range of about 450 to 460 nm. However, the emission wavelength of the LED devices 51 is not specifically limited. The LED devices 51 may be green LEDs emitting green light or red LEDs emitting red light, for example. Further, the emission wavelength of the LED devices 51 may be different between the LED packages 5. For example, the LED devices 51 in some of the LED packages 5 may be blue LEDs, while those of the other LED packages 5 may be green LEDs.

As shown in FIGS. 7(C) to 7(E) described later, in each LED package 5, the LED devices 51 are mounted in a rectangular lattice pattern on the mounting part 41 of the lead frame 40. For simplicity, these figures show an example where sixteen LED devices 51 are mounted.

However, the number of LED devices 51 included in each LED package 5 is not specifically limited, and may be one, for example.

The lower surfaces of the LED devices 51 are fixed on the upper surface of the mounting part 41 with an electrically insulating transparent adhesive, for example. Each LED device 51 includes a pair of device electrodes on the upper surface thereof. As shown in FIG. 7(D), the device electrodes of adjacent LED devices 51 are electrically connected to each other by wires 52. The wire 52 extending from the LED devices 51 located at edges of the mounting part 41 are connected to the electrode part 44a or 44b. Accordingly, the LED devices 51 are supplied with a current through the wires 52.

The resin frame 53 is a rectangular white resin frame, for example, and is fixed on the mounting part 41 and the electrode parts 44a and 44b so as to straddle the insulating resin 42 exposed in the upper surface of the lead frame 40. The resin frame 53 is a dam member which defines the region into which the sealing resin 54 is filled and prevents the sealing resin 54 from flowing out. The resin frame 53 also encloses the LED devices 51 mounted on the mounting part 41, and causes light emitted laterally from the LED devices 51 to reflect toward the upper side of the LED package 5 (circuit board 2).

The shape of the resin frame 53 is not limited to rectangular, but may be circular, for example. However, if a large number of LED devices 51 are mounted at high density, preferably the LED devices 51 should be arranged in a rectangular lattice pattern in the mounting region defined by the rectangular resin frame 53.

The sealing resin 54 is a colorless and transparent thermosetting resin, such as an epoxy resin or a silicone resin, and filled into a space on the mounting part 41 enclosed by the resin frame 53 to integrally cover and protect (seal) the LED devices 51 and the wires 52. The sealing resin 54 may contain a phosphor excited by the LED devices 51. For example, if the LED devices 51 are blue LEDs, the sealing resin 54 may contain a yellow phosphor, such as yttrium aluminum garnet (YAG). In this case, the LED package 5 mixes blue light emitted from the LED devices 51 and yellow light generated by exciting the yellow phosphor with the blue light, thereby emitting white light. The sealing resin 54 may contain two or more phosphors, such as a yellow phosphor and a red phosphor, or contain a different phosphor for each LED package 5.

The lens resin 55 is a substantially hemispherical component formed on the upper side of the opening 12 into which the LED package 5 is inserted. The lens resin 55 covers the whole sealing resin 54, and condenses light emitted from the LED devices 51 through the sealing resin 54. The lens resin 55 is formed from a transparent resin, such as a silicone resin, by injection molding after the LED package 5 is mounted at the opening 12 from the back side of the circuit board 2.

FIGS. 7(A) to 7(H) and 8(A) to 8(H) are top views and cross-sectional views for explaining a manufacturing process of the light-emitting apparatus 1. These figures show one of the LED packages 5 in the light-emitting apparatus 1.

Figure 8:
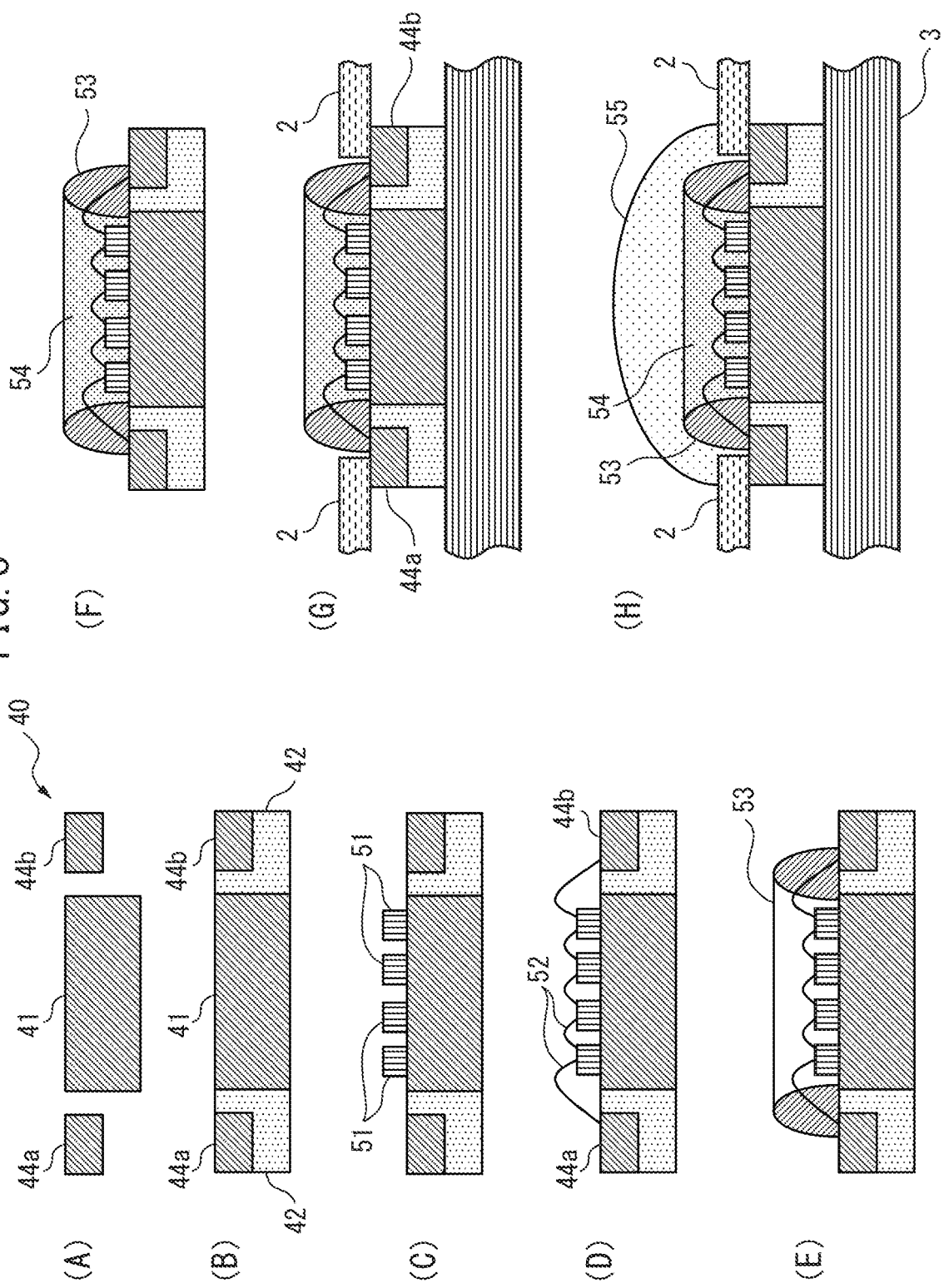
FIGS. 8(A) to 8(H) are cross-sectional views for explaining a manufacturing process of the light-emitting apparatus 1.

First of all, a description will be given of a manufacturing process of the LED packages 5 included in the light-emitting apparatus 1. In manufacturing the LED packages 5, the lead frame 40 shown in FIGS. 7(A) and 8(A) is first manufactured, for example, by performing half-etching on a substrate array in which multiple sets of metal pieces which will become mounting parts 41 and electrode parts 44a and 44b are connected to each other, thereby shaving off portions on the back side of the metal pieces corresponding to the electrode parts 44a and 44b. Then, as shown in FIGS. 7(B) and 8(B), the insulating resin 42 is filled between the mounting part 41 and the electrode parts 44a and 44b and into a space on the back side of the electrode parts 44a and 44b.

Next, as shown in FIGS. 7(C) and 8(C), the LED devices 51 are fixed by die bonding in a rectangular lattice pattern on the upper surface of the mounting part 41. Then, as shown in FIGS. 7(D) and 8(D), the LED devices 51 are electrically connected by wires 52 to each other and to the electrode parts 44a and 44b. Subsequently, as shown in FIGS. 7(E) and 8(E), the resin frame 53 is fixed on the upper surface of the lead frame 40. Thereafter, as shown in FIGS. 7(F) and 8(F), the sealing resin 54 is filled into a region enclosed by the resin frame 53. In this way, the LED packages 5 shown in FIG. 6 are completed.

Further, as shown in FIGS. 7(G) and 8(G), the finished LED packages 5 are fixed on the upper surface of the heat sinking substrate 3, while the upper surfaces of the electrode parts 44a and 44b are soldered to the conductive patterns on the back surface of the circuit board 2. For mounting the LED packages 5, a conductive adhesive, such as an Ag paste, may be used. In order to reduce variations in height of the LED packages 5, they may be fixed on the upper surface of the heat sinking substrate 3 with heat sinking sheets having thermal conductivity and elasticity interposed therebetween.

Thereafter, as shown in FIGS. 7(H) and 8(H), the hemispherical lens resin 55 is formed by injection molding, for example, on the upper side of the circuit board 2, over each of the openings 12 into which the LED package 5 is inserted. The light-emitting apparatus 1 shown in FIGS. 1 to 6 is thus completed.

Figure 18:
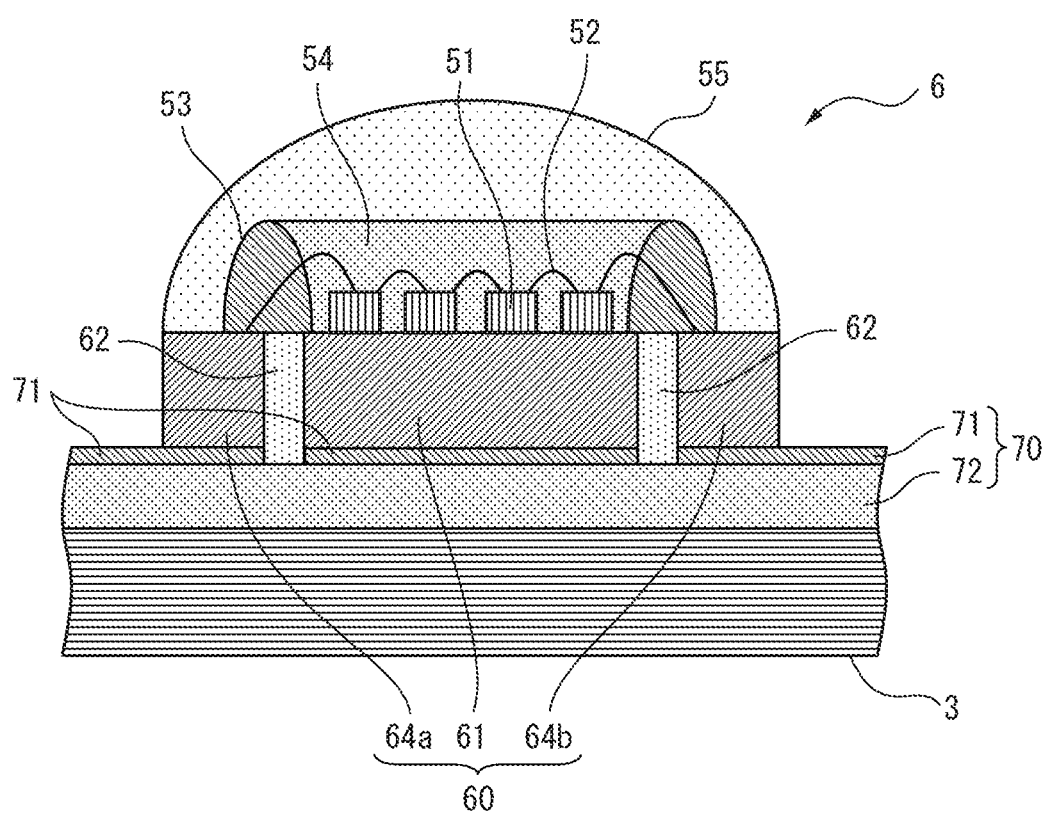
FIG. 18 is a cross-sectional view of a conventional surface-mounted LED package 6.

Since the back surface of the mounting part 41 on which the LED devices 51 are mounted is directly in contact with the heat sinking substrate 3, each LED package 5 of the light-emitting apparatus 1 has improved heat dissipation characteristics as compared to the LED package 6 shown in FIG. 18. In the light-emitting apparatus 1, this facilitates designing a device generating a large amount of heat, and allows for increasing the number of LED devices mounted in each LED package, as compared to the case where the LED package 6 is used.

On the back side of the LED packages 5, the mounting part 41 is exposed, but the electrode parts 44a and 44b are not exposed. In each LED package 5, since the insulating resin 42 is interposed between the electrode parts 44a and 44b and the beat sinking substrate 3, the distance between the circuit board 2 and the heat sinking substrate 3 is longer than in the LED package 6, which also improves electrical insulation.

Unlike a light-emitting apparatus including the LED package 6, the light-emitting apparatus 1 has a planar region on the circuit board 2, which results in a high degree of flexibility in designing. For example, this allows for increasing or reducing the size of the lens resin 55. Further, since the same metal substrate as in a surface-mounted LED package can be used as the lead frame 40 of each LED package 5, products can be provided at low cost.

FIGS. 9(A) and 9(B) are a cross-sectional view and a top view of an LED package 5 of a light-emitting apparatus 1A. The light-emitting apparatus 1A is identical in structure to the light-emitting apparatus 1, except that the light-emitting apparatus 1A further includes a reinforcing resin 56. The reinforcing resin 56 is a component formed from a silicone resin into a frame shape, for example, and is disposed between the circuit board 2 and the lens resin 55 so as to be in contact with the outer surfaces of the resin frame 53 and enclose the resin frame 53. Preferably the reinforcing resin 56 should be harder than the resin frame 53 and the lens resin 55 and have a Shore D hardness of about 30 to 90. In the light-emitting apparatus 1A, the LED packages 5 are first mounted on the circuit board 2; the reinforcing resin 56 is then formed around the resin frame 53 of each LED package 5; and the lens resin 55 is thereafter formed over the resin frame 53, the sealing resin 54 and the reinforcing resin 56.

In the light-emitting apparatus 1, the circuit board 2 may be deformed during light emission, due to the thermal expansion of the lens resin 55 caused by heat generation of the LED package 5. In contrast, in the light-emitting apparatus 1A, the reinforcing resin 56 having a high hardness between the circuit board 2 and the lens resin 55 prevents deformation of the circuit board 2.

Figure 10:
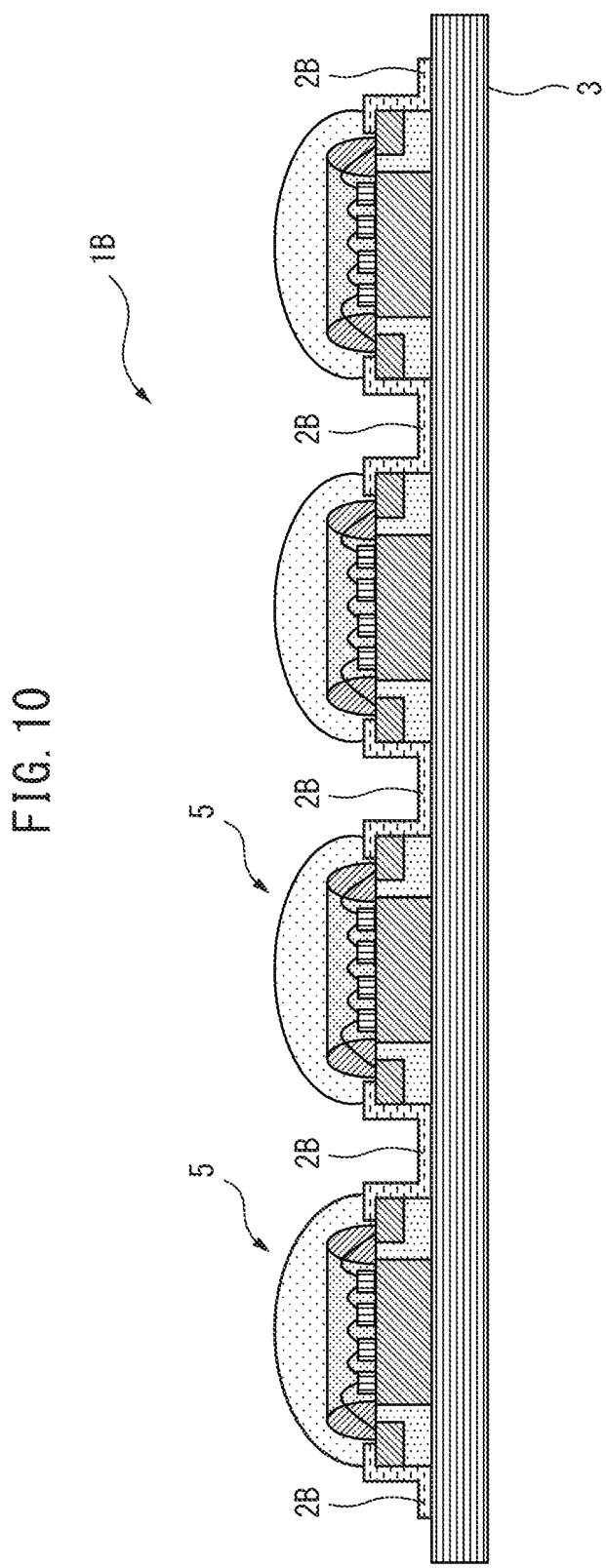
FIG. 10 is a cross-sectional view of a light-emitting apparatus 1B.

FIG. 10 is a cross-sectional view of a light-emitting apparatus 1B. The light-emitting apparatus 1B is identical in structure to the light-emitting apparatus 1, except for the shape of its circuit board 2B. The circuit board 2B is a flexible printed circuit, and is bent along the side surfaces of the lead frame 40 of each package 5 mounted on the circuit board 2B in the same manner as in the light-emitting apparatus 1. Accordingly, the back surface of the circuit board 2B is in contact with the side surfaces of the electrode parts 44a and 44b and the insulating resin 42 and the upper surface of the heat sinking substrate 3, between the openings 12. In the light-emitting apparatus 1, the circuit board 2 and the heat sinking substrate 3 are separated from each other between the openings 12. However, the use of a flexible printed circuit as the circuit board eliminates these spaces, as in the light-emitting apparatus 1B.

Eliminating these spaces reduces mounting stress applied on the LED packages 5 at the time of fixing the light-emitting apparatus 1 to a lighting fixture. If a rigid substrate including a glass cloth is used as the circuit board 2, for example, it is raised from the heat sinking substrate 3 at the edges of the light-emitting apparatus 1 in which the LED packages 5 are mounted on the circuit board 2 and the heat sinking substrate 3. When the light-emitting apparatus 1 is fixed to a lighting fixture, the edges of the circuit board 2 are fixed by such means as screws. In this case, stress applied during fixing greatly warps the circuit board 2, which causes stress on the LED packages 5 based on the principle of leverage. However, since the use of a flexible printed circuit eliminates the spaces between the circuit board 2 and the heat sinking substrate 3, it reduces the stress applied on the LED packages 5.

Figure 11:
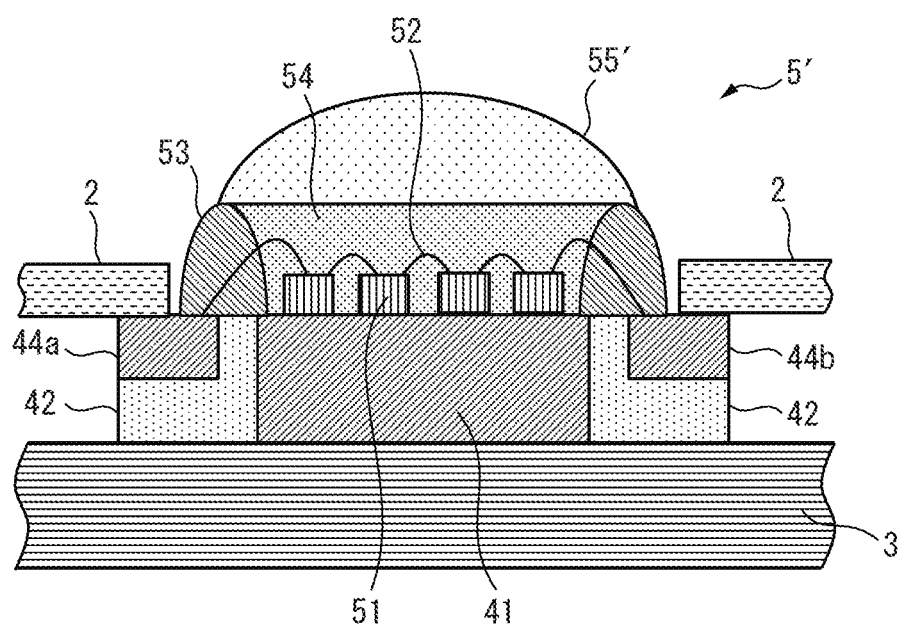
FIG. 11 is a cross-sectional view of an LED package 5'.

FIG. 11 is a cross-sectional view of an LED package 5'. The LED package 5' is identical in structure to the LED package 5, except for the size of the lens resin. The lens resin 55 of the LED package 5 is formed so as to cover all the upper side of the opening 12 of the circuit board 2, after the LED package 5 is mounted on the circuit board 2. The lens resin 55' of the LED package 5' has a hemispherical shape similarly to the lens resin 55, but is not sufficiently large to cover all the upper side of the opening 12, and is formed only on the resin frame 53 and the sealing resin 54 during manufacturing individual LED packages. The light-emitting apparatuses 1, 1A and 1B may include an LED package having a preformed lens resin, such as the LED package 5'.

Figure 12:
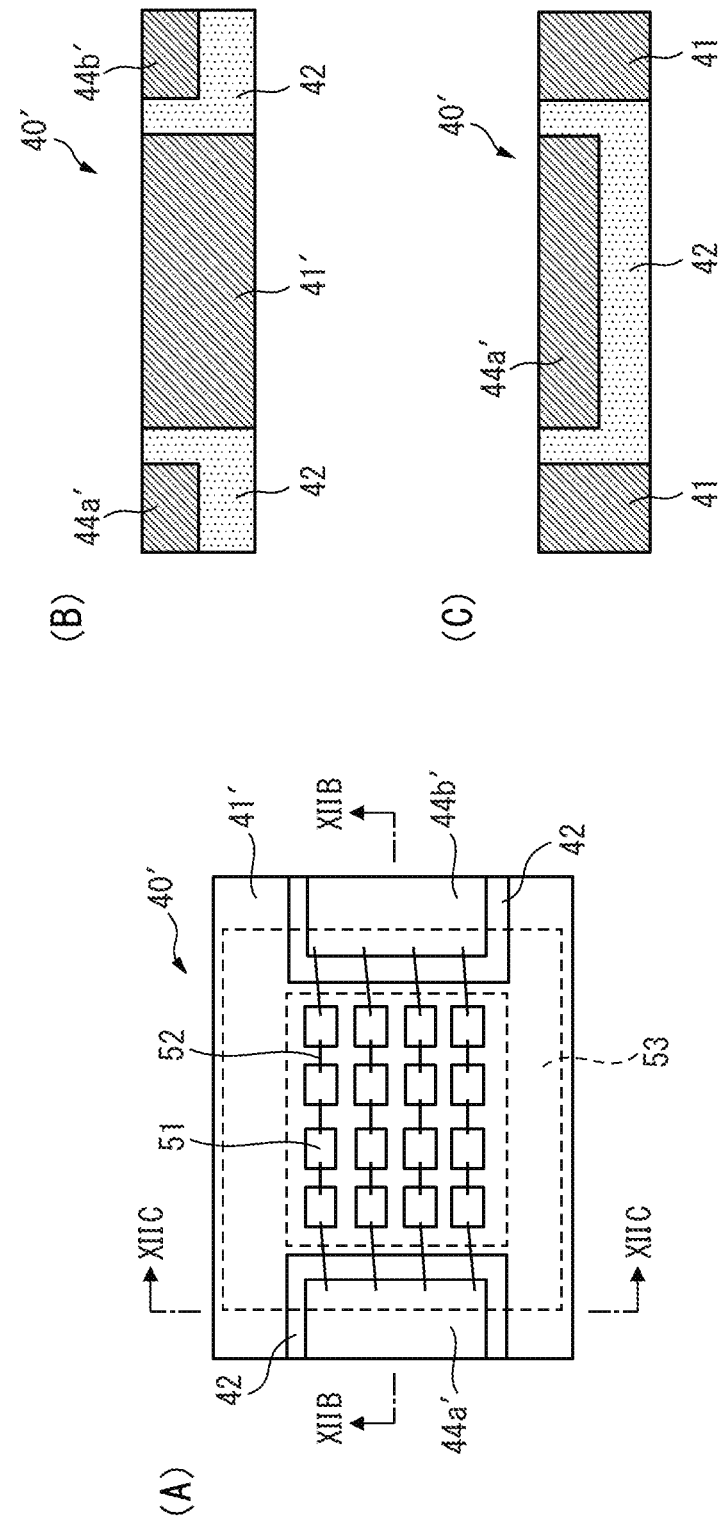
FIGS. 12(A) to 12(C) are diagrams showing a modified example of the shape of the lead frames of the LED packages.

FIGS. 12(A) to 12(C) are diagrams showing a modified example of the shape of the lead frames of the LED packages. FIG. 12(A) shows the upper surface of a lead frame 40' including a mounting part 41' and electrode parts 44a' and 44b', while FIGS. 12(B) and 12(C) show cross sections of the lead frame 40' taken along lines XIIB-XIIB and XIIC-XIIC in FIG. 12(A), respectively. FIG. 12(A) also shows LED devices 51, wires 52 and a resin frame 53 superposed on the lead frame 40'. The lead frame 40' differs from the lead frame 40 only in shapes and sizes of the mounting part 41' and the electrode parts 44a' and 44b'; but the functions of these components are the same as in the lead frame 40.

In the lead frame 40', the electrode parts 44a' and 44b' have a rectangular shape smaller than the electrode parts 44a and 44b of the lead frame 40. The mounting part 41' has an H-shaped upper surface, and encloses three side surfaces of each of the electrode parts 44a' and 44b'. Accordingly, in the lead frame 40', portions of the insulating resin 42 filled between the mounting part 41' and the electrode parts 44a' and 44b' are bent in three directions along the shape of the mounting part 41'. This shape makes the insulating resin between the mounting part and the electrode parts less likely to be detached (prevents it from falling out) as compared to the shape shown in FIGS. 7(B) and 8(B), and thus increases the strength of the lead frame including an insulating resin. The LED packages 5 and 5' may include the lead frame 40' shown in FIGS. 12(A) to 12(C), instead of the lead frame 40.

FIGS. 13(A), 13(B), 14(A) to 14(C) and 15(A) to 15(D) are cross-sectional views of LED packages 5A to 5I, respectively. The LED packages 5A to 5I are identical in structure to the LED package 5, except for the presence or absence of the lens resin and the shape of the lead frame. Since the LED devices 51, the wires 52, the resin frame 53 and the sealing resin 54 are the same as those in the LED package 5, they will not be further described herein. The light-emitting apparatuses respectively including the LED packages 5A to 5I further include a reinforcing resin 56 in contact with the outer surfaces of the resin frame 53, as in the light-emitting apparatus 1A.

Figure 13:
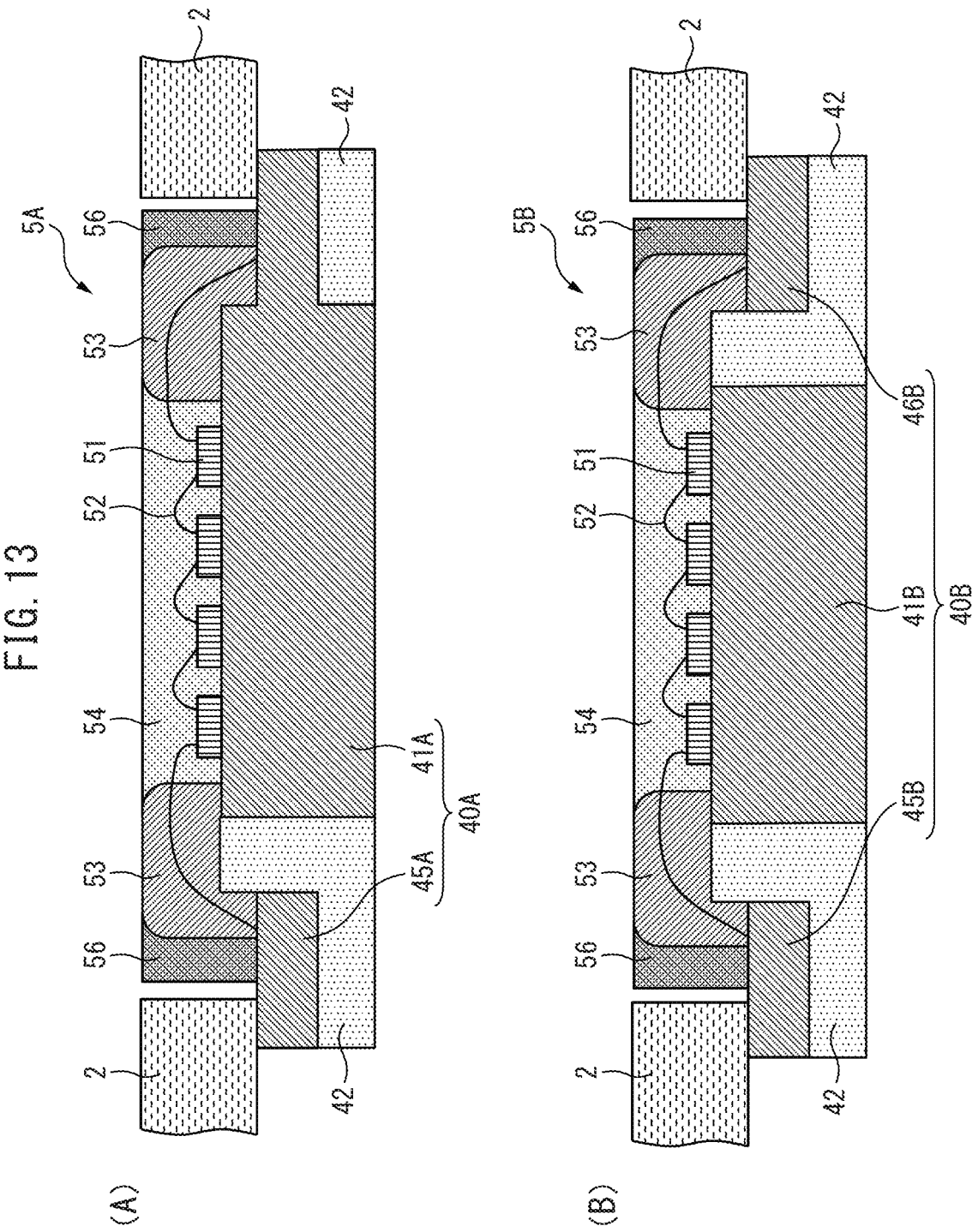
FIGS. 13(A) and 13(B) are cross-sectional views of LED packages 5A and 5B.

The lead frame 40A of the LED package 5A shown in FIG. 13(A) has a two-terminal structure, and includes a mounting part 41A and an electrode part 45A. The mounting part 41A also functions as an electrode part. In the LED package 5A, the wires 52 are connected to the upper surfaces of the electrode part 45A and a portion of the mounting part 41A at the edge opposite to the electrode part 45A. In the lead frame 40A, the upper surfaces of the electrode part 45A and the edge of the mounting part 41A to which the wires 52 are connected are lower than the upper surface of a portion of the mounting part 41A on which the LED devices 51 are mounted.

The lead frame 40B of the LED package 5B shown in FIG. 13(B) has a three-terminal structure, and includes a mounting part 41B and electrode parts 45B and 46B. The mounting part 41B and the electrode parts 45B and 46B correspond to the ground, anode and cathode, respectively. In the lead frame 40B also, the upper surfaces of the electrode parts 45B and 46B are lower than the upper surface of the mounting part 41B.

As in the lead frames 40A and 40B, the upper surfaces of portions which will become electrode terminals may be lowered as compared to the mounting surface of the LED devices 51, by performing etching on part of the lead frame, for example. In other words, the upper surface of the mounting part of the lead frame may be higher than the upper surfaces of the electrode parts. Then, when the LED packages are mounted on the back side of the circuit board 2, the upper surface of the mounting part (mounting surface of the LED devices 51) of the lead frame is placed higher than the back surface of the circuit board 2 in the opening thereof. Accordingly, the LED devices 51 (light-emitting surface) are placed higher than in the case where a lead frame including a mounting part and electrode parts whose upper surfaces are on the same plane is used. This reduces the amount of light absorbed on the inner surface of the openings of the circuit board 2, and thus improves the light flux of the light-emitting apparatus.

The LED package 5C shown in FIG. 14(A) is identical in structure to the LED package 5 including a reinforcing resin 56, except that the lens resin is omitted. The lead frame 40C of the LED packages 5C includes a mounting part 41C and electrode parts 45C and 46C, which are the same as the mounting part 41 and the electrode parts 44a and 44b of the lead frame 40. In the example shown in FIG. 14(A), a lens 80 for condensing light emitted from the LED package 5C is disposed above the LED package 5C, instead of the lens resin.

The lead frame 40D of the LED package 5D shown in FIG. 14(B) has a three-terminal structure, and includes a mounting part 41D and electrode parts 45D and 46D. The lead frame 40E of the LED package 5E shown in FIG. 14(C) has a two-terminal structure, and includes a mounting part 41E and an electrode part 45E. In the lead frame 40D, in contrast to the lead frame 40B, the upper surface of the mounting part 41D is lower than the upper surfaces of the electrode parts 45D and 46D. In the lead frame 40E also, the upper surface of the center portion of the mounting part 41E on which the LED devices 51 are mounted is lower than the upper surfaces of the electrode part 45E and the edge of the mounting part 41E to which the wires 52 are connected.

As in the lead frames 40D and 40E, the mounting surface of the LED devices 51 may be lowered as compared to the upper surfaces of portions which will become electrode terminals, by performing etching, for example. Then, the LED devices 51 (light-emitting surface) are placed lower than in the case where the lead frame 40C including a mounting part and electrode parts whose upper surfaces are on the same plane is used. This allows for bringing the lens 80 nearer to the LED package. More specifically, the distance h1 between the lower surface of the lens 80 and the upper surface of the sealing resin 54 in the LED package 5C is larger than the distance h2 therebetween in the LED packages 5D and 5E (h1>h2). Therefore, the LED package 5D or 5E allows for reducing the thickness of the whole light-emitting apparatus including lenses 80, as compared to the case where the LED package 5C is used.

Figure 15:
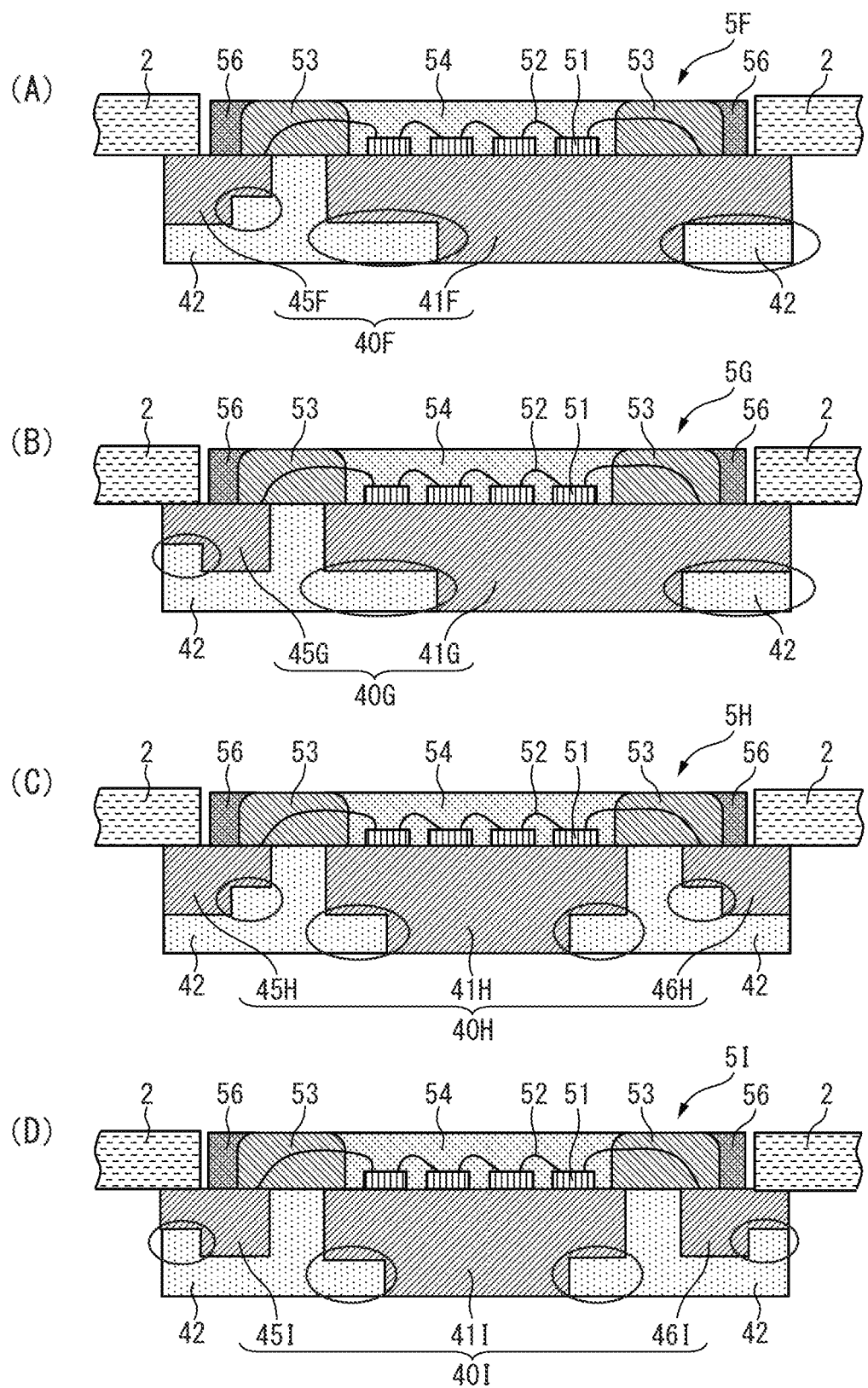
FIGS. 15(A) to 15(D) are cross-sectional views of LED packages 5F to 5I.

The lead frames 40F and 40G of the LED packages 5F and 5G shown in FIGS. 15(A) and 15(B) have a two-terminal structure, and include a mounting part 41F and an electrode part 45F, and a mounting part 41G and an electrode part 45G, respectively. The lead frames 40H and 40I of the LED packages 5H and 5I shown in FIGS. 15(C) and 15(D) have a three-terminal structure, and include a mounting part 41H and electrode parts 45H and 46H, and a mounting part 41I and electrode parts 45I and 46I, respectively. In the lead frames 40F to 40I, steps are formed at lower portions of the mounting parts 41F to 41I and the electrode parts 45F to 45I, 46H and 46I as indicated by ovals in the figures. Due to these steps, the mounting parts and electrode parts each have a right-angled hook shape. The insulating resin 42 of each of the LED packages 5F to 5I fills recesses formed by these steps in the mounting part and electrode parts.

As in the lead frames 40F to 40I, steps may be formed in the mounting part and electrode parts by performing half-etching during manufacturing the lead frame. The insulating resin filling the recesses formed by these steps in the mounting part and electrode parts increases the strength of the lead frame including an insulating resin, and prevents detachment of the electrode parts. The steps indicated by ovals in the figures may only form one of the mounting part and electrode parts.

Figure 16:
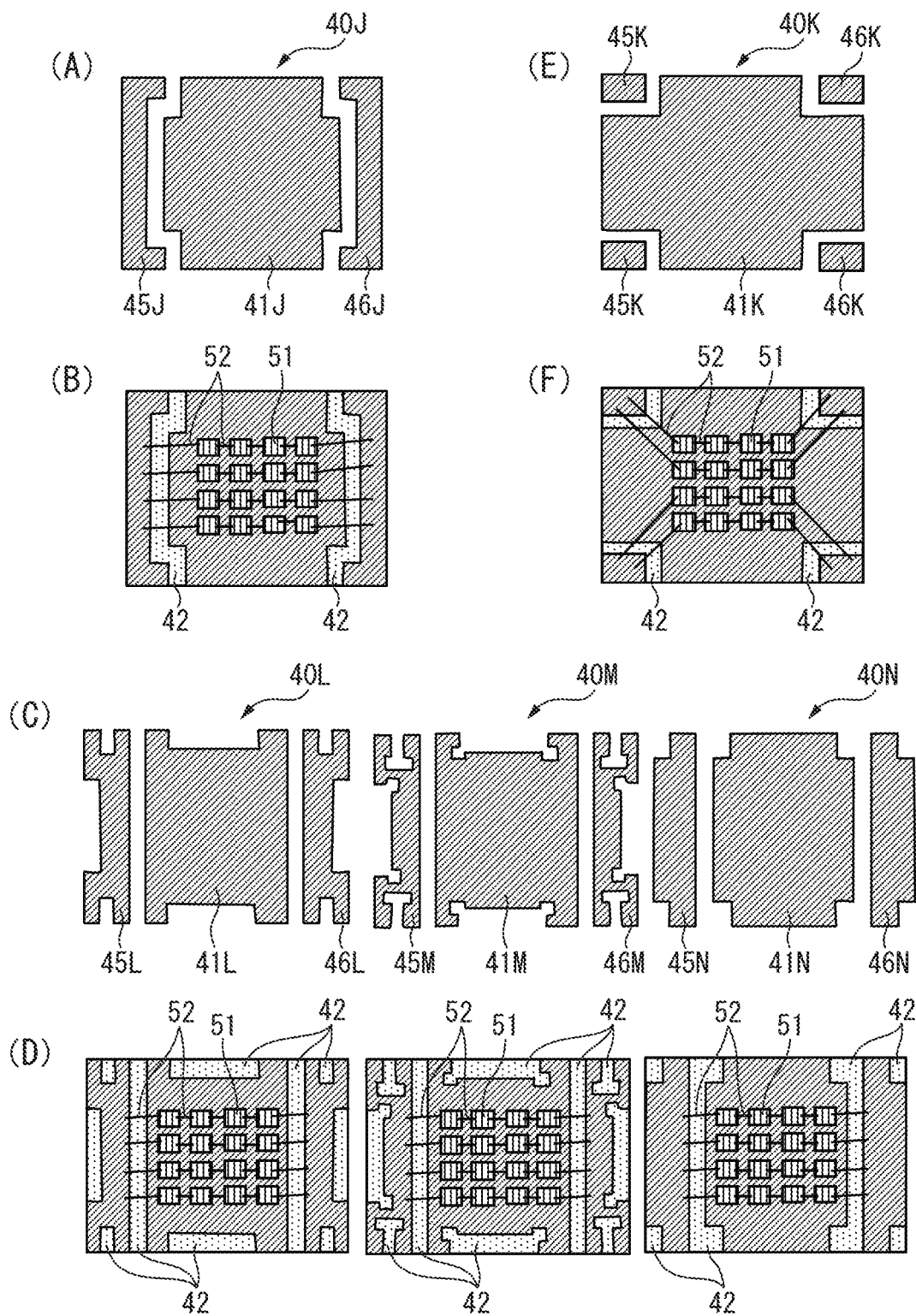
FIGS. 16(A) to 16(F) are diagrams showing modified examples of the shape of the lead frames of the LED packages.

FIGS. 16(A) to 16(F) and 17(A) to 17(D) are diagrams showing modified examples of the shape of the lead frames of the LED packages. FIG. 16(A) shows a lead frame 40J including a mounting part 41J and electrode parts 45J and 46J, while FIG. 16(E) shows the upper surface of a lead frame 40K including a mounting part 41K and electrode parts 45K and 46K. FIGS. 16(B) and 16(F) respectively show the upper surfaces of the lead frames 40J and 40K having an insulating resin 42 filled into the spaces, LED devices 51 mounted thereon and wires 52 connected thereto.

The mounting part 41J of the lead frame 40J includes lateral projections at the centers of the edges facing the electrode parts 45J and 46J, while the electrode parts 45J and 46J each include a recess larger than these lateral projections at the edge facing the mounting part 41J. Accordingly, the insulating resin 42 of the lead frame 40J is bent between the mounting part 41J and the electrode parts 45J and 46J along their uneven shapes. When viewed from above, the mounting part 41K of the lead frame 40K has a cross shape projecting in four directions. The electrode parts 45K are disposed at two of the four corners of the rectangle in which the cross shape is inscribed, while the electrode parts 46K are disposed at the other two corners. Accordingly, the insulating resin 42 of the lead frame 40K is also bent like a dogleg between the mounting part 41K and the electrode parts 45K and 46K.

As in the lead frames 40J and 40K, the mounting part may have an uneven side surface so as to be extend along side surfaces of an electrode part by cutting off part of the mounting part and electrode part; and the insulating resin filled therebetween may be bent in a plurality of directions along this uneven side surface. This has the advantages of preventing detachment of the electrode part of the lead frame, improving heat dissipation characteristics, and also reducing the occurrence of cracks in the insulating resin.

FIG. 16(C) shows the upper surfaces of a lead frame 40L including a mounting part 41L and electrode parts 45L and 46L, a lead frame 40M including a mounting part 41M and electrode parts 45M and 46M, and a lead frame 40N including a mounting part 41N and electrode parts 45N and 46N. FIG. 16(D) shows the upper surfaces of the lead frames 40L to 40N having an insulating resin 42 filled into the spaces, LED devices 51 mounted thereon and wires 52 connected thereto. The mounting parts and electrode parts of the lead frames 40L to 40N have side surfaces provided with cuts into which the insulating resin 42 is filled. The lead frames 40L to 40N also have the advantages of preventing detachment of the electrode parts and improving heat dissipation characteristics.

The shapes of the cuts are not limited to rectangles in the illustrated examples, and may be circles or other polygons, for example. Although every cut extends through the lead frame in the thickness direction in the illustrated examples, these cuts may only form a portion in the thickness direction. Further, the cuts may only form one of the mounting part and electrode parts.

Figure 17:
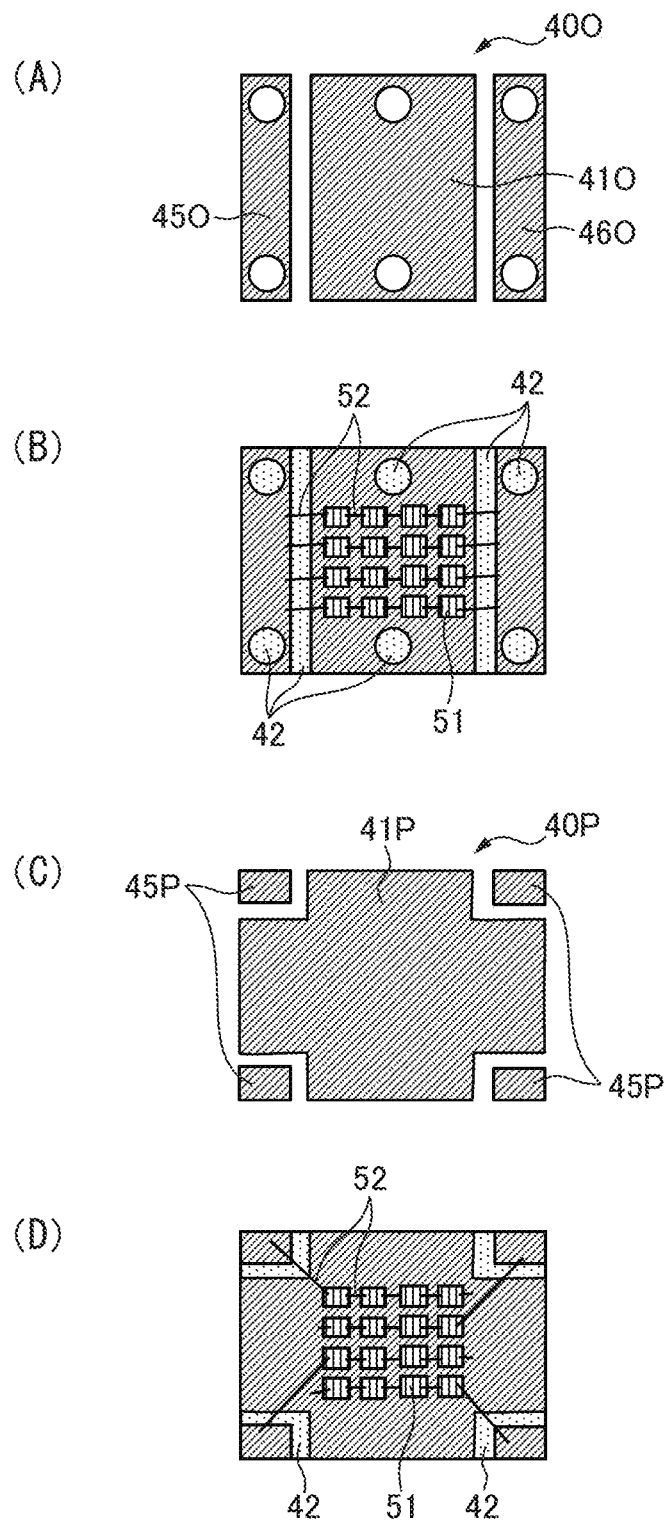
FIGS. 17(A) to 17(D) are diagrams showing modified examples of the shape of the lead frames of the LED packages.

FIG. 17(A) shows the upper surface of a lead frame 40O including a mounting part 41O and electrode parts 45O and 46O, while FIG. 17(B) shows that of the lead frame 40O having an insulating resin 42 filled into the spaces, LED devices 51 mounted thereon and wires 52 connected thereto. The mounting part 41O and the electrode parts 45O and 46O of the lead frame 40O have through holes extending therethrough in the thickness direction. The insulating resin 42 is filled not only between the mounting part 41O and the electrode parts 45O and 46O but also into these through holes. The lead frame 40O also has the advantages of preventing detachment of the electrode parts and improving heat dissipation characteristics. The shape of the through holes is not limited to a circle in the illustrated example, and may be rectangles or other polygons, for example. Further, the through holes may only form one of the mounting part and electrode parts.

FIG. 17(C) shows the upper surface of a lead frame 40P including a mounting part 41P and electrode parts 45P, while FIG. 17(D) shows that of the lead frame 40P having an insulating resin 42 filled into the spaces, LED devices 51 mounted thereon and wires 52 connected thereto. The lead frame 40P has the same shape as the lead frame 40K, but differs in wiring from the lead frame 40K.

More specifically, in the lead frame 40K, the mounting part 41K and the electrode parts 45K and 46K correspond to the ground, anode and cathode (positive and negative electrodes), respectively. The LED devices 51 are divided into four groups each including four devices and connected in parallel with each other. In each group, the LED devices 51 are connected in series in the same direction; and the anodes and cathodes thereof are electrically connected by wires to one of the two electrode parts 45K and one of the two electrode parts 46K, respectively. In contrast, in the lead frame 40P, the mounting part 41P and the four electrode parts 45P correspond to the cathode and anode, respectively. In the lead frame 40P, the LED devices 51 are series-parallel connected as in the lead frame 40K; however, the series-connected LED devices 51 in every two groups adjoining in the vertical direction of the figure are connected to opposite electrode parts in the lateral direction. In each group, the anodes and cathodes of the LED devices 51 are electrically connected by wires to one of the four electrode parts 45P and the mounting part 41, respectively.

When the lead frame 40P is used, the wiring may be as shown in FIG. 17(D). In this case, light emission can be controlled based on the groups of the series-connected LED devices 51, and improves heat dissipation characteristics.

The stepped shape shown in FIGS. 15(A) to 15(D), the uneven shape or the cuts shown in FIGS. 16(A) to 16(F), and the through holes shown in FIGS. 17(A) and 17(B) may be combined in one lead frame.

The invention claimed is:

1. A light-emitting apparatus comprising:
  a circuit board having an opening;
  an LED package inserted into the opening from the back side of the circuit board and having an edge connected to the back side of the circuit board; and
  a heat sinking substrate disposed on the back side of the circuit board so as to be in contact with the LED package, wherein
  the LED package comprises:
    an LED device;
      package substrate having an upper surface on which the LED device is mounted and a back surface being in contact with the heat sinking substrate, and
      the package substrate being electrically connected to the LED device and the circuit board;
    a sealing resin filled into a region on the package substrate to seal the LED device;
    a resin frame defining the region into which the sealing resin is filled;

a lens resin filled so as to cover the sealing resin, the lens resin condensing light emitted from the LED device through the sealing resin; and a reinforcing resin being harder than the lens resin and disposed between the circuit board and the lens resin so as to enclose an outer portion of the resin frame.

2. The light-emitting apparatus according to claim 1, wherein the:

reinforcing resin is harder than the resin frame.

3. The light-emitting apparatus according to claim 1, wherein the circuit board is a flexible printed circuit, and is bent along side surfaces of the package substrate so as not to form a space between the circuit board and the heat sinking substrate.

4. The light-emitting apparatus according to claim 1, wherein the upper surface of a portion of the package substrate where the LED device is mounted is higher than electrodes of the package substrate connected to the circuit board, and is placed higher than the back surface of the circuit board in the opening of the circuit board.

5. The light-emitting apparatus according to claim 1, wherein the upper surface of a portion of the package substrate where the LED device is mounted is lower than electrodes of the package substrate connected to the circuit board.

6. A method for manufacturing a light-emitting apparatus comprising the steps of:

mounting an LED device on the upper surface of a package substrate, and electrically connecting the LED device to the electrode part electrodes of the package substrate;

forming a resin frame enclosing the LED device on the upper surface of the package substrate;

filling a sealing resin into a region on the package substrate enclosed by the resin frame to seal the LED device, thereby manufacturing an LED package including the package substrate, the LED device, the resin frame and the sealing resin;

inserting the LED package into an opening of a circuit board from the back side of the circuit board, and electrically connecting the electrodes of the package substrate to the back side of the circuit board, while disposing a heat sinking substrate on the back side of the circuit board so that the back surface of the package substrate is in contact with the heat sinking substrate;

forming a reinforcing resin on the upper surface of the circuit board around the opening, so as to enclose an outer portion of the resin frame; and forming a lens resin on the resin frame, the sealing resin and the reinforcing resin, the lens resin condensing light emitted from the LED device through the sealing resin, wherein the reinforcing resin is harder than the lens resin.

* * * * *